United States Patent
Checcchinato et al.

(10) Patent No.: US 6,203,386 B1
(45) Date of Patent: Mar. 20, 2001

(54) TERMINAL BLADES MOUNTED ON FLEXIBLE SUBSTRATES

(75) Inventors: Bruno Checchinato, Padua; Lorenzo Manassero, Turin; Roberto Martucci; Mario Previato, both of Padua, all of (IT); Helmut Zischka, Weissach/Flacht (DE)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/184,412

(22) Filed: Nov. 2, 1998

(30) Foreign Application Priority Data

Nov. 24, 1997 (EP) .................................. 97120530

(51) Int. Cl.[7] ................................................ H01R 4/10
(52) U.S. Cl. ............................................................ 439/877
(58) Field of Search ..................... 439/877, 880, 439/492; 174/266, 261, 267; 361/749, 760

(56) References Cited

U.S. PATENT DOCUMENTS

| | | | |
|---|---|---|---|
| 2,499,296 | * 2/1950 | Buchaman | 439/877 |
| 3,181,110 | * 4/1965 | Waters | 439/877 |
| 4,655,522 | 4/1987 | Beck, Jr. et al. | 339/32 |
| 5,133,673 | 7/1992 | Dijkshoorn | 439/422 |
| 5,384,435 | 1/1995 | Fuerst et al. | 174/262 |
| 5,456,616 | 10/1995 | Fuerst et al. | 439/620 |

\* cited by examiner

*Primary Examiner*—Khiem Nguyen
*Assistant Examiner*—J. F. Duverne
(74) *Attorney, Agent, or Firm*—Stacey E. Caldwell

(57) ABSTRACT

An electrical device includes a flat flexible dielectric substrate having a generally round hole of a given diameter. A ductile conductive film is on the substrate in an area at least about the hole. A generally flat terminal blade has a transversely projecting pin portion inserted into the hole in the substrate in contact with the conductive film. Therefore, the flat terminal blade is generally parallel to the flat flexible dielectric substrate. The cross-dimension of the pin portion is greater than the diameter of the round hole. In the preferred embodiment, the dielectric substrate is less than 0.050 inch thick, and the difference between the cross-dimension of the pin portion and the diameter of the round hole is on the order of 5% to 50% of the diameter of the hole.

25 Claims, 2 Drawing Sheets

TERMINAL BLADES MOUNTED ON FLEXIBLE SUBSTRATES

FIELD OF THE INVENTION

This invention generally relates to the art of electrical connectors and, particularly, to an electronic device wherein a terminal blade is electrically coupled through holes in a flat flexible circuit or substrate.

BACKGROUND OF THE INVENTION

A variety of electrical connecting devices are designed for utilization with a flat flexible circuit which may be mounted directly in circuit with terminal pins, for instance. Generally, a flat flexible circuit includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Normally, each hole is smaller in diameter than a respective pin. Alternatively, the pin may be punched through the flat flexible circuit to establish the electrical and mechanical connection therewith.

Generally flat terminal blades also have been electrically coupled to flat flexible circuits or substrates. However, because the terminal blades are generally flat, the blades are not inserted into holes in the flat flexible circuit. The blades are coupled to the conductors or conductive film on the circuit substrate by solder or other conductive adhesives.

When using terminal pins, in order to assure good electrical and mechanical connections, solder or other conductive adhesives also are often used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesives were developed to replace soldering techniques which require specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, that patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems with conductive adhesives by establishing an electrical connection directly between the terminal pin and the flat conductor on the flat flexible substrate by controlling various parameters between the pin and the substrate. In the system of the '435 patent, the terminal pin is round in cross-section, and the round pin is inserted into a round hole in the flat flexible substrate.

Although this system has proven quite effective for electrically coupling terminal pins through holes in flat flexible circuits or substrates, the advantages of such systems would be highly desirable for use with generally flat terminal blades which, as stated above, are soldered or otherwise conductively adhered directly to the conductive film on the circuit substrate. The present invention is directed to satisfying this need and solving the problems of using relatively expensive solder or conductive adhesives to interconnect flat terminals to flat circuits.

SUMMARY OF THE INVENTION

An object, therefore, of the invention is to provide a new system for mounting generally flat electrical terminals on a flat flexible substrate or flexible circuit.

In the exemplary embodiment of the invention, an electronic device includes a flat flexible dielectric substrate having a generally round hole of a given diameter. A ductile conductive film is deposited on the substrate in an area at least about the hole. A generally flat terminal blade has a transversely projecting pin portion inserted into the hole in the substrate in contact with the conductive film. Therefore, the flat terminal blade is generally parallel to the flat flexible dielectric substrate, and the pin portion projects generally perpendicular to the substrate. The cross-dimension of the pin portion is greater than the diameter of the round hole.

As disclosed herein, the flat flexible dielectric substrate is less than 0.050 inch thick. The difference between the cross-dimension of the pin portion of the flat terminal blade and diameter of the round hole is on the order 5% to 50% of the diameter of the hole.

The ductile conductive film may be plated with a tin/lead material. The pin portion of the flat terminal blade may be plated with a common conductive plating material, such as the tin/lead material. The substrate may be fabricated of polyimide material or polyester material. The hole in the substrate may be a prepunched hole.

In the preferred embodiment, the terminal blade is shown to be elongated. A plurality of the pin portions are spaced longitudinally of the terminal blade and are inserted into a corresponding plurality of holes in the substrate. The pin portions of the flat terminal blades are generally hollow, and the distal ends of the pins may be formed radially outwardly to enlarge the distal ends.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
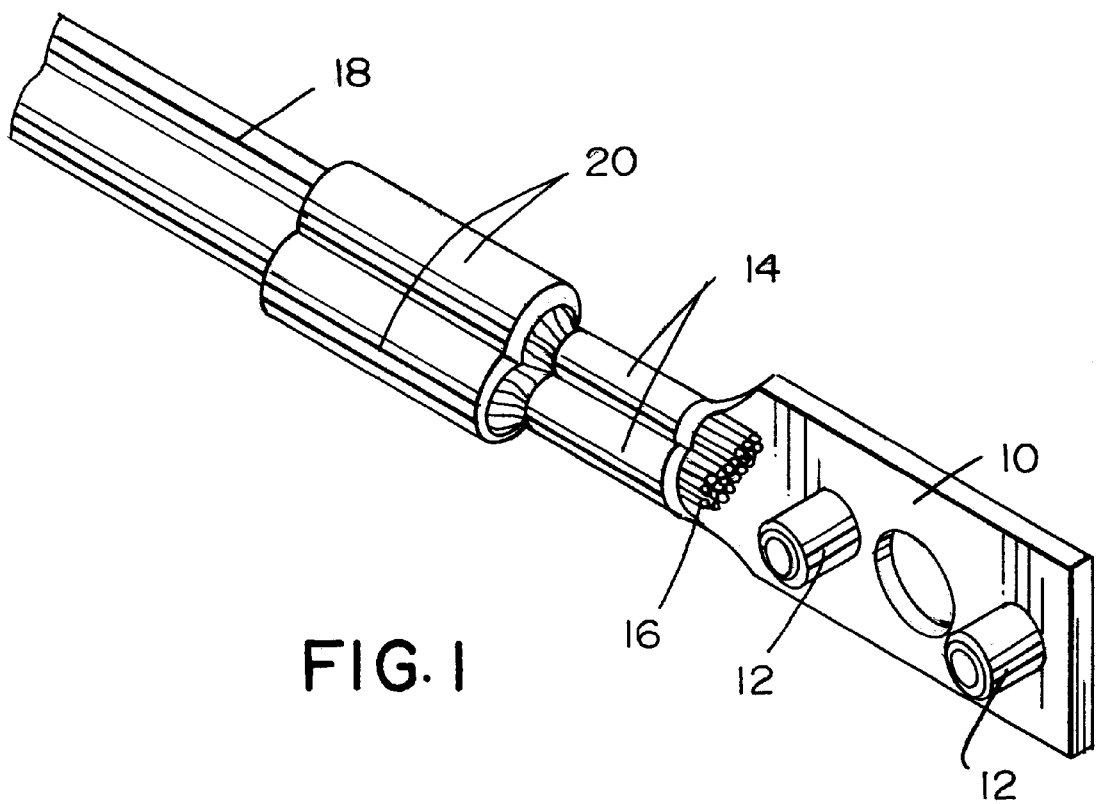
FIG. 1 is a perspective view of a flat terminal blade according to the invention; with the blade terminated at one end to an electrical wire.

Referring to the drawings in greater detail, and first to FIG. 1, the invention is embodied in a termination system which includes a generally flat terminal blade 10 having at least one transversely projecting pin portion 12. The pin portions are round and project generally perpendicularly away from blade 10. The terminal blade is elongated and has a pair of crimp arms 14 at one end for crimping onto the conductors 16 of an electrical cable 18. The blade has a second pair of crimp arms 20 for crimping onto the outside of the cable to provide strain relief therefore.

Figure 2:
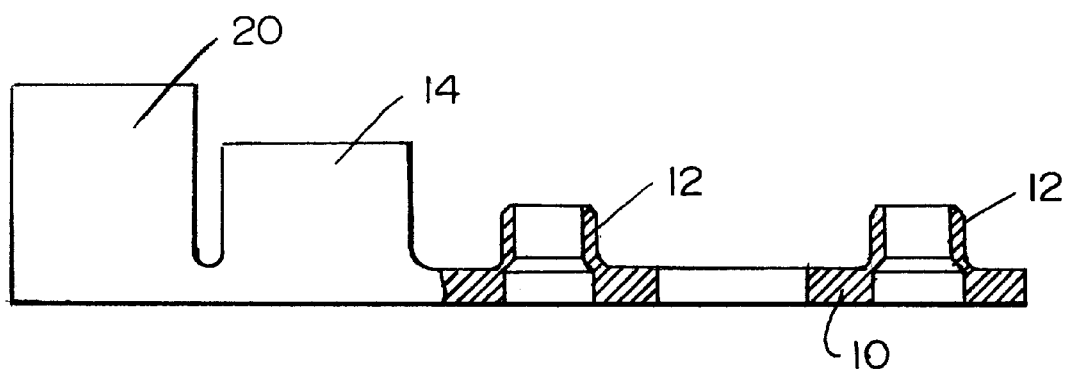
FIG. 2 is a side elevational view of the terminal blade of FIG. 1, partially broken away and in section, prior to terminating the blade.

FIG. 2 shows flat terminal blade 10 in its unterminated condition. Crimp arms 14 and 20 are open for receiving the electrical cable. It can be seen that transversely projecting pin portions 12 are generally hollow or cylindrical. The flat terminal blade can be stamped and formed from conductive sheet metal material. The projecting pin portions can be punched or drawn into their hollow shape from the material of the blade, whereby the projecting pin portions are integral or unitary with the blade. One or a plurality of pin portions 12 are contemplated by the invention.

Figure 3:
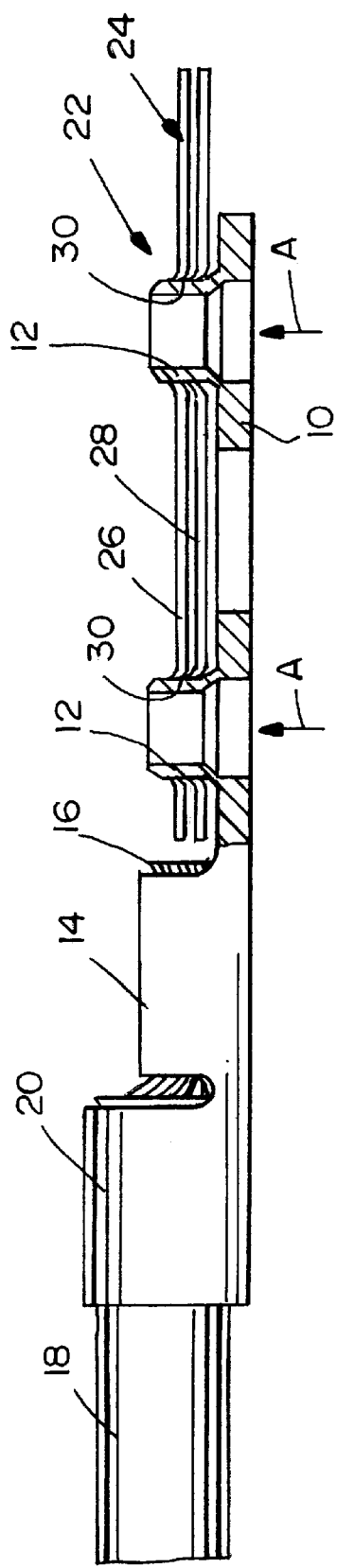
FIG. 3 is a view similar to that of FIG. 2, but with the terminal blade terminated to the electrical wire and also terminated to a flat flexible circuit.

FIG. 3 shows terminal blade 10 again terminated to electrical cable 18 as described above and shown in FIG. 1. This type of termination is generally known in the art. However, FIG. 3 shows an electronic device, generally designated 22, wherein the flat terminal blade is terminated to a flat flexible circuit, generally designated 24, by means of transversely projecting pin portions 12.

More particularly, flat flexible circuit 24 includes a flat flexible dielectric substrate 26 having a ductile conductive film 28 thereon. The flat conductor or film 28 may be of a copper material with a tin/lead plating on one side thereof (i.e. the side which engages terminal pin portions 12). Substrate 26 has precut or prepunched round holes 30 to facilitate insertion of pin portions 12 through the flat flexible circuit in the direction of arrows "A" to the position shown in FIG. 3. At least the outside of at least the pin portions 12 of terminal blade 10 may be plated with a tin/lead alloy. Of course, other alloys, such as a tin/nickel alloy can be used, and pure plating materials such as tin, gold or aluminum could also be used in specific applications such as harsh environments or the like where more expensive and therefore less corrosive platings would be more suitable. Although typically both the conductive film 28 and the pin portions 12 would be plated with a common conductive plating material, such as tin/lead, the interface can also be plated with dissimilar platings where applications require.

Flat flexible dielectric substrate 26 preferably is less than 0.050 inch thick. Holes 30 in the substrate preferably are round. However, when used herein and in the claims hereof, the term "round" to describe the cross-sectional configuration of holes 30 is not meant to be limited to a precise circular hole. The same is true for round pin portions 12. For instance, an elliptical pin portion may be inserted in a corresponding elliptical hole as long as the minor and major axes of the two elliptical configurations are aligned.

As stated above, flat flexible dielectric substrate 26 preferably is less 0.050 inch thick. The substrate may be of various materials, but a polyimide material has proven effective. Other materials, such as a polyester material also could be used. Holes 30 in the flat flexible substrate are preformed, such as being prepunched, in order to prevent the substrate material from tearing or "running" when pin portions of a diameter larger than the diameter of the holes are inserted into the holes.

The invention contemplates the use of a principal which may be called a "controlled meniscus". In other words, in order to eliminate the use of solder, epoxies and the like, a particular interference is established between pin portions 12 and flat flexible circuit 26 in the curved area of the circuit around holes 30 which, in essence, is a deformed peripheral area of the circuit which applies normal forces to the pin portions when the pin portions are inserted into the holes in the direction of arrows "A". This area and the interference forces are controlled by controlling the relative diameters of pin portions 12 and holes 30. It has been found that good electrical connections can be maintained when the difference between the diameter of one of the pin portions 12 and the diameter of its respective hole 30 is on the order of 5% to 50% of the diameter of the hole. This could be termed the "interference" parameter.

By maintaining the above parameters, secondary operations such as soldering the pin portions to the flat conductor of the flat flexible circuit, or using epoxy or other adhesives between the pin portions and the flexible circuit can be completely eliminated and still maintain a good electrical connection between the pin portions and the flat conductor of the flexible circuit.

Figure 4:
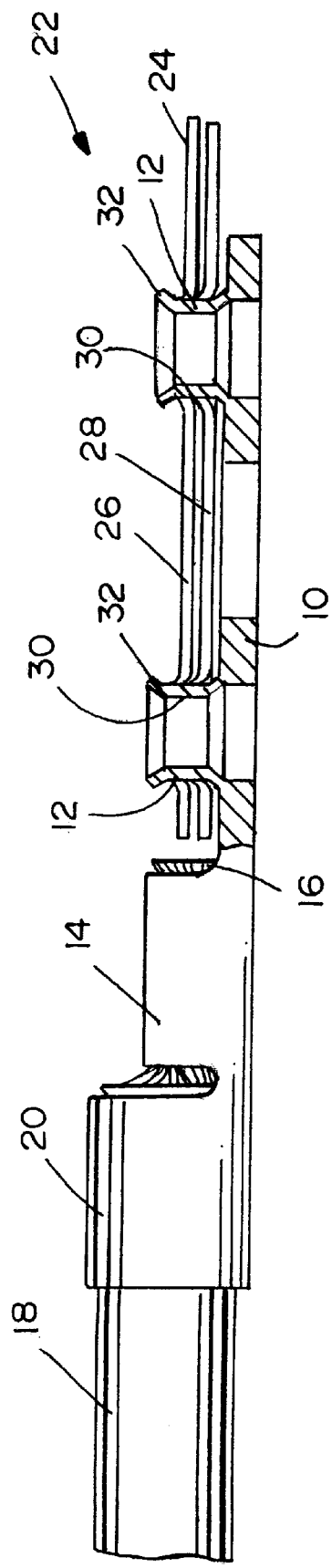
FIG. 4 is a view similar to that of FIG. 3, but of an alternate embodiment of the invention.

FIG. 4 shows an alternative embodiment of the invention. In essence, FIG. 4 is substantially identical to FIG. 3, except that the distal ends of pin portions 12 of flat terminal blade 10 have been enlarged, as at 32. These enlargements can be formed by a properly configured punch or other forming tool, by flaring the end of an open-ended pin, or swaging the end of a closed-ended pin, for example. Although these enlarged distal ends of the pin portions are not necessary to establish good electrical connection between the pin portions and the conductive film of the flat flexible circuit, the enlarged ends help to prevent the flexible circuit from being pulled off of the pin portions after termination, such as in shipping or handling or other secondary operations and provides strain relief to the flexible circuit. The amount of enlargement of the distal ends of the pin can actually increase the pin diameter to correspondingly increase the retention between the pin and the flexible circuit. Therefore, the enlarged distal ends of the pin, as at 32, improves the retention of the flexible circuit onto the terminal blade.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electronic device, comprising:
    a flat flexible dielectric substrate less than 0.050 inch thick and having a generally round hole of a given diameter;
    a ductile conductive film on the substrate in an area at least around said hole;
    a generally flat terminal blade of sheet metal material and having a pin portion formed integrally therewith and projecting therefrom into the hole in the substrate in contact with the conductive film, whereby the flat terminal blade is generally parallel to the flat flexible substrate, the cross-dimension of the pin portion being greater than the diameter of the round hole; and
    wherein the difference between the cross-dimension of the pin portion and the diameter of the round hole is on the order of 5% to 50% of the diameter of the hole.

2. The electronic device of claim 1 wherein at least the pin portion of the terminal blade is plated with a tin/lead material.

3. The electronic device of claim 1 wherein said ductile film is plated with a tin/lead material.

4. The electronic device of claim 1 wherein said ductile conductive film and at least the pin portion of said terminal blade are plated with a common conductive plating material.

5. The electronic device of claim 1 wherein said ductile conductive film and at least the pin portion of said terminal blade are plated with one of a generally pure tin, gold or aluminum plating material.

6. The electronic device of claim 1 wherein said substrate is fabricated of polyimide material.

7. The electronic device of claim 1 wherein said substrate is fabricated of polyester material.

8. The electronic device of claim 1 wherein said hole in the substrate is a prepunched hole.

9. The electronic device of claim 1 wherein said flat terminal blade is elongated, and including a plurality of said pin portions spaced longitudinally of the terminal blade and inserted into a corresponding plurality of holes in the substrate.

10. The electronic device of claim 1 wherein the pin portion of said flat terminal blade is generally hollow and the distal end thereof is enlarged.

11. An electronic device, comprising:
    a flat flexible dielectric substrate having a generally round hole of a given diameter;
    a ductile conductive film on the substrate in an area at least around said hole;
    a generally flat terminal blade of sheet metal material and having a pin portion formed integrally therewith and projecting therefrom into the hole in the substrate in contact with the conductive film, whereby the flat terminal blade is generally parallel to the flat flexible substrate, the cross-dimension of the pin portion being greater than the diameter of the round hole; and
    wherein the difference between the cross-dimension of the pin portion and the diameter of the round hole is on the order of 5% to 50% of the diameter of the hole.

12. The electronic device of claim 11 wherein at least the pin portion of the terminal blade is plated with a tin/lead material.

13. The electronic device of claim 11 wherein said ductile film is plated with a tin/lead material.

14. The electronic device of claim 11 wherein said ductile conductive film and at least the pin portion of said terminal blade are plated with a common conductive plating material.

15. The electronic device of claim 11 wherein said ductile conductive film and at least the pin portion of said terminal blade are plated with one of a generally pure tin, gold and aluminum plating material.

16. The electronic device of claim 11 wherein said flat terminal blade is elongated, and including a plurality of said pin portions spaced longitudinally of the terminal blade and inserted into a corresponding plurality of holes in the substrate.

17. The electronic device of claim 11 wherein the pin portion of said flat terminal blade is generally hollow and the distal end thereof is enlarged to facilitate retention of the flat flexible substrate on the flat terminal blade.

18. An electronic device, comprising:
    a flat flexible dielectric substrate having a generally round hole of a given diameter;
    a ductile conductive film on the substrate in an area of at least around said hole; and
    a generally flat terminal blade of sheet metal material and having a pin portion formed integrally therewith and projecting therefrom into the hole in the substrate in contact with the conductive film, whereby the flat terminal blade is generally parallel to the flat flexible substrate, the cross-dimension of the pin portion being greater than the diameter of the round hole.

19. The electronic device of claim 18 wherein at least the pin portion of the terminal blade is plated with a tin/lead material.

20. The electronic device of claim 18 wherein said ductile film is plated with a tin/lead material.

21. The electronic device of claim 18 wherein said ductile conductive film and at least the pin portion of said terminal blade are plated with a common conductive plating material.

22. The electronic device of claim 18 wherein said ductile conductive film and at least the pin portion of said terminal blade are plated with one of a generally pure tin, gold and aluminum conductive plating material.

23. The electronic device of claim 18 wherein said flat terminal blade is elongated, and includes a plurality of said pin portions spaced longitudinally of the terminal blade and inserted into a corresponding plurality of holes in the substrate.

24. The electronic device of claim 18 wherein the pin portion of said flat terminal blade is generally hollow and the distal end thereof is formed radially outwardly to enlarge the distal end.

25. The electronic device of claim 18 wherein said hole in the substrate is a prepunched hole.

* * * * *